(12) United States Patent
Koo et al.

(10) Patent No.: US 7,598,095 B2
(45) Date of Patent: Oct. 6, 2009

(54) FERROELECTRIC MEMORY AND FERROELECTRIC CAPACITOR WITH IR-ALLOY ELECTRODE OR RU-ALLOY ELECTRODE AND METHOD OF MANUFACTURING SAME

(75) Inventors: June-mo Koo, Seoul (KR); Young-soo Park, Gyeonggi-do (KR); Sang-min Shin, Seoul (KR); Suk-pil Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 452 days.

(21) Appl. No.: 11/193,415

(22) Filed: Aug. 1, 2005

(65) Prior Publication Data

US 2006/0027847 A1 Feb. 9, 2006

(30) Foreign Application Priority Data

Aug. 5, 2004 (KR) ...................... 10-2004-0061793

(51) Int. Cl.
*H01L 21/00* (2006.01)
*H01L 21/242* (2006.01)
*H01L 21/31* (2006.01)
*H01L 21/469* (2006.01)
(52) U.S. Cl. ........................ 438/3; 438/240; 438/785
(58) Field of Classification Search ................ 438/3, 438/73
See application file for complete search history.

(56) References Cited

U.S. PATENT DOCUMENTS 4,443,317 A * 4/1984 Kawashima et al. ...... 204/290.1

(Continued)

FOREIGN PATENT DOCUMENTS

CN 1221221 A 6/1999

(Continued)

OTHER PUBLICATIONS

European Search Report dated Jun. 16, 2008.

(Continued)

*Primary Examiner*—Ha Tran T Nguyen
*Assistant Examiner*—Valerie Brown
(74) *Attorney, Agent, or Firm*—Harness, Dickey & Pierce, P.L.C.

(57) ABSTRACT

A ferroelectric capacitor comprises a first electrode comprising an alloy containing a first element and a second element of the periodic table of the elements, the first element being selected from the group consisting of Ir and Ru. A ferroelectric layer is disposed on the first electrode, wherein the ferroelectric layer comprises a ferroelectric material containing the second element. A second electrode is disposed on the ferroelectric layer. The ferroelectric capacitor can be provided as part of a memory cell of a ferroelectric memory.

22 Claims, 7 Drawing Sheets

U.S. PATENT DOCUMENTS

| | | | |
|---|---|---|---|
| 5,508,953 | A | 4/1996 | Fukuda et al. |
| 6,337,216 | B1 | 1/2002 | Koo |
| 6,344,413 | B1 | 2/2002 | Zurcher et al. |
| 6,368,910 | B1 | 4/2002 | Sheu et al. |
| 6,521,932 | B1 | 2/2003 | Kumagai et al. |
| 6,528,386 | B1 | 3/2003 | Summerfelt et al. |
| 6,605,835 | B2 | 8/2003 | Lee |
| 6,645,779 | B2 | 11/2003 | Hong |
| 6,818,522 | B2 | 11/2004 | Yoon |
| 2001/0050389 | A1 | 12/2001 | Moriya et al. |
| 2002/0189404 | A1* | 12/2002 | Schutz et al. ................ 75/612 |
| 2003/0112649 | A1 | 6/2003 | Wouters et al. |
| 2004/0014248 | A1* | 1/2004 | Kim ............................ 438/3 |
| 2004/0087085 | A1 | 5/2004 | Lee et al. |

FOREIGN PATENT DOCUMENTS

EP    1 054 441 A2    11/2000

OTHER PUBLICATIONS

Chinese Office Action dated Jun. 20, 2008 in Chinese Patent Application No. 20050089744.6.

English Translation of Chinese Office Action dated Jun. 20, 2008 in Chinese Patent Application No. 200510089744.6.

* cited by examiner

Ir as deposited (RMS 4.4 Å)

Ir after 30 min at 600°C in $O_2$ (RMS 130 Å)

$Ir_{0.76}Ti_{0.24}$ alloy as deposited (RMS 5 Å)

$Ir_{0.76}Ti_{0.24}$ alloy after 30 min at 600°C in $O_2$ (RMS 27 Å)

FERROELECTRIC MEMORY AND FERROELECTRIC CAPACITOR WITH IR-ALLOY ELECTRODE OR RU-ALLOY ELECTRODE AND METHOD OF MANUFACTURING SAME

BACKGROUND

1. Field of the Invention

The present invention relates to ferroelectric capacitors and ferroelectric memories. More particularly, the invention relates to alloy compositions for the bottom electrode of a ferroelectric capacitor, which can be used in a ferroelectric memory.

2. Background Information

Ferroelectric random access memory (FRAM) is a non-volatile memory that maintains stored data without the need for maintaining power to the device. A memory cell (also referred to as a storage node) of an FRAM commonly employs a ferroelectric capacitor having a bottom electrode, a top electrode and a ferroelectric layer disposed therebetween. The ferroelectric layer is made of a ferroelectric material that exhibits spontaneous electric polarization that can be maintained in the absence of power and that can be reversed in direction by the application of an appropriate electric field. Thus, the polarization direction of the ferroelectric layer of a given memory cell corresponds to a data storage state.

FIG. 1 illustrates a portion of memory cell 100 of an FRAM comprising a conventional three dimensional ferroelectric capacitor 101. The memory cell 100 comprises a Si substrate 110 having a source region 114 in contact with a contact plug 122. The contact plug is disposed within a first $SiO_2$ layer 120. A TiAlN oxidation barrier 103 is disposed within a trench 111 in a second $SiO_2$ layer 128 and in contact with the contact plug 122. A Ti adhesion layer 105 is disposed within the trench 111 and on the TiAlN oxidation barrier 103.

The ferroelectric capacitor 101 is disposed is within the trench 111 and in contact with the Ti adhesion layer 105. The ferroelectric capacitor 101 comprises an iridium (Ir) bottom electrode 102, a lead titanate (PTO) seed layer 107 disposed on the bottom and sides of the Ir bottom electrode 102, a lead-zirconate-titanate (PZT) ferroelectric layer 104 disposed adjacent to the Ir bottom electrode 102 and in contact with the PTO seed layer 107, and a top electrode 106 disposed on the PZT ferroelectric layer 104. The Ti adhesion layer 105 is conventionally used because the Ir bottom electrode 102 would not otherwise adhere well to the sidewalls of the trench 111 formed in the second $SiO_2$ layer 128.

FIG. 2 illustrates another conventional ferroelectric capacitor 200 comprising an Ir bottom electrode 202, a PZT ferroelectric layer 204 and a top electrode 106. U.S. Patent Application Publication No. 2003/0112649 discloses a ferroelectric memory with a ferroelectric capacitor wherein the bottom electrode is an Ir layer or a Ru layer. U.S. Pat. No. 6,368,910 discloses ferroelectric memories with ferroelectric capacitors wherein the bottom electrode of the capacitor is a Pt layer, an Ir layer or a Ru layer. The entire contents of U.S. 2003/0112649 and U.S. Pat. No. 6,368,910 are incorporated herein by reference.

There is a trend to manufacture FRAM such as the FRAM 100 illustrated in FIG. 1 at smaller cell sizes and at increased memory densities (e.g., manufacturing FRAM having smaller three-dimensional capacitors such as capacitor 101). With regard to this trend, the present inventors have observed that fabrication problems or performance problems can arise because there can be insufficient space within the trench 111 to form the multiplicity of layers 102-107 at sufficient thicknesses to possess good film quality, especially with regard to the PZT ferroelectric layer 104. Thus, for a trench 111 having a diameter of about 0.15 µm and below, for example, forming the conventional multiplicity of layers 102-107 may require forming the PZT ferroelectric layer 104 at a small thickness such that the that PZT ferroelectric layer 104 suffers greater leakage current than is desired. Greater leakage current can result in greater power consumption and/or poorer retention of stored information in a corresponding FRAM. Alternatively, forming the Ti adhesion layer 105, the Ir bottom electrode 102, and the PTO seed layer 107, and the ferroelectric layer 304 at optimal thicknesses may leave too little space to form a top electrode 106 of sufficient thickness that also conforms to the PZT ferroelectric layer along its sidewalls. In other words, the opening in the trench 111 may get "plugged" during fabrication such that a conforming top electrode 106 of sufficient thickness cannot be formed. It is also possible that there may not be sufficient space to form the ferroelectric layer 304 of a desired thickness.

The present inventors have also observed that the conventional use of an Ir layer as a bottom electrode 102 can result in a rough surface of a PZT ferroelectric layer 104 deposited thereon (e.g., without a PTO seed layer 107), wherein a rougher surface of the PZT ferroelectric layer 104 is indicative of relatively poorer film quality compared to smoother PZT surfaces. The relatively poorer film quality of PZT ferroelectric layers that have rougher surfaces can lead to decreased performance of a ferroelectric capacitor in the form of greater leakage current, for example, which can result in greater power consumption and/or poorer retention of stored information in a corresponding FRAM. Thus, greater thicknesses of the ferroelectric layer 104 may be needed to achieve acceptable performance in such devices. However, as noted above, increasing the film thickness of the ferroelectric layer 104 may not be compatible with the trend of decreasing cell sizes and increasing memory densities.

In addition, in instances where it is desirable for the bottom electrode layer to comprise a conductive oxide, deposition of iridium oxide is difficult. Moreover, using Ir for the entire bottom electrode is costly due to its high cost.

SUMMARY OF THE INVENTION

The present inventors have recognized that it would be desirable to provide a layer structure for a ferroelectric capacitor in a ferroelectric memory that is suitable for higher density ferroelectric memory with smaller cell sizes, wherein the layers, including the ferroelectric layer, possess high film quality. The present inventors have determined that it would be desirable to provide a simpler and less expensive layer structure for a ferroelectric capacitor in a ferroelectric memory wherein the layer structure has a reduced number layers compared to conventional devices and wherein the layers include multipurpose layers.

In one aspect, a ferroelectric capacitor comprises a first electrode comprising a compound, the compound including a first metallic element and a second metallic element of the periodic table of the elements, wherein the first metallic element is selected from the group consisting of Ir and Ru. A ferroelectric layer is disposed in direct contact with the compound of the first electrode, wherein the ferroelectric layer comprises a ferroelectric material containing the second element. A second electrode is disposed on the ferroelectric layer.

In another aspect, a ferroelectric memory comprises a substrate and a plurality of memory cells arranged on the substrate. Each memory cell comprises a first electrode comprising a compound, the compound including a first metallic element and a second metallic element of the periodic table of the elements, wherein the first metallic element is selected from the group consisting of Ir and Ru. Each memory cell also comprises a ferroelectric layer disposed in direct contact with the compound of the first electrode, wherein the ferroelectric layer comprises a ferroelectric material containing the second element. A second electrode is disposed on the ferroelectric layer.

In another aspect, a method of fabricating a ferroelectric capacitor comprises forming a first electrode comprising a compound, the compound including a first metallic element and a second metallic element of the periodic table of the elements, wherein the first metallic element is selected from the group consisting of Ir and Ru. The method also comprises forming a ferroelectric layer in direct contact with the compound of the first electrode, wherein the ferroelectric layer comprises a ferroelectric material containing the second element. The method further comprises forming a second electrode on the ferroelectric layer. In a further aspect, the method can comprise forming the ferroelectric capacitor as part of a memory cell of a ferroelectric memory.

BRIEF DESCRIPTION OF THE FIGURES

The above and other features and advantages of the present invention will become more apparent by the following description of exemplary embodiments thereof, to which the present invention is not limited, with reference to the attached figures. It is noted that not all possible embodiments of the present invention necessarily exhibit each and every, or any, of the advantages identified herein.

DESCRIPTION OF EXEMPLARY EMBODIMENTS

Figure 3A:
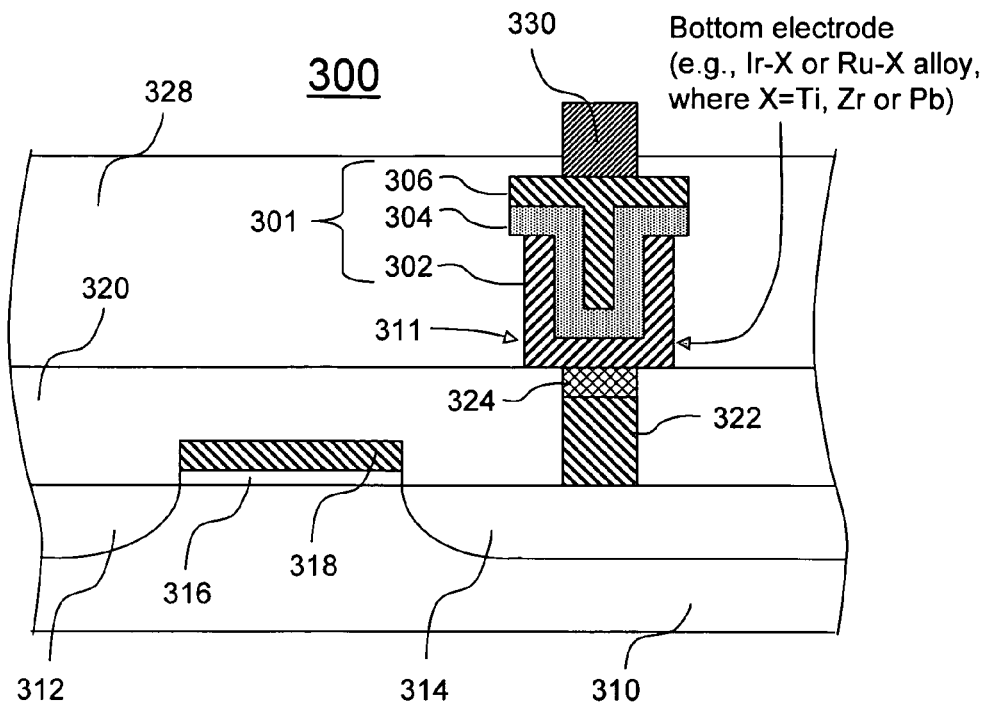
FIGS. 3A and 3B are schematic illustrations of exemplary ferroelectric memory cells.

According to one exemplary embodiment, a ferroelectric memory is provided comprising a substrate and a plurality of memory cells arranged on the substrate. FIG. 3A illustrates a portion of a memory cell 300 of an exemplary ferroelectric memory in cross-sectional view. The memory cell 300 is arranged on a substrate 310 and comprises a ferroelectric capacitor 301 disposed within a trench 311. The ferroelectric capacitor comprises a first electrode 302 (bottom electrode) comprising a compound. The compound includes a first metallic element and a second metallic element, wherein the first and second metallic elements are elements of the periodic table of the elements, and wherein the first metallic element is selected from the group consisting of Ir and Ru. The ferroelectric capacitor 301 also comprises a ferroelectric layer 304 disposed in direct contact with the compound of the first electrode 302, wherein the ferroelectric layer 304 comprises a ferroelectric material containing the second element. The ferroelectric capacitor 301 also comprises a second electrode 306 (top electrode) disposed on the ferroelectric layer 304. The use of the words "top" and "bottom" herein are merely for convenience in view of the orientation of exemplary features in the drawings and should not be construed as being restrictive in any way. Further, the phrase "disposed on" as used herein includes the possibility of intervening structures, such as intervening layers.

In the example of FIG. 3A, the memory cell 300 also comprises a transistor structure having a drain region 312 and a source region 314 arranged in the substrate 310 (e.g., any suitable semiconductor substrate such as silicon), as well as a gate oxide 316 (e.g., $SiO_2$, $Ta_2O_5$, or other suitable insulator) and a gate electrode 318 (e.g., Al, Pt, W, or other suitable conducting material) disposed on the gate oxide 316 and between the drain 312 and source 314. A first insulating layer 320 (e.g., $SiO_2$ or other insulating material) surrounds the gate oxide 316 and the gate electrode 318.

A contact plug 322 (made of, e.g., W, Ru, $Ru/RuO_2$, TiN, polysilicon or any suitable conductor) makes electrical contact between the bottom electrode 302 and the source region 314. A plate line 330 (e.g., Al, Pt, or other suitable conductive material) makes electrical contact to the top electrode 306. A barrier layer 324 (made of, e.g, TiN, TiSiN, TiAlN) can also be provided, if desired, between the contact plug 322 and the bottom electrode 302. A second insulating layer 328 (e.g., $SiO_2$ or other insulating material) surrounds the ferroelectric capacitor 301 such as illustrated, for example, in FIG. 3A. A word line (not shown) can be connected to the gate electrode 318, and a bit line (not shown) can be connected to the drain 312, as known to those of ordinary skill in the art. Any suitable thicknesses and dimensions for the bottom electrode 302, the ferroelectric 304 and the top electrode 306 can be used, the choices of which can be made by one of ordinary skill in the art depending upon the desired performance specifications of the ferroelectric memory.

The ferroelectric layer 304 can be made of any suitable material such as lead-zirconate-titanate (PZT) also referred to as $PbZrTiO_3$ (though not necessarily limited to that composition), strontium-bismuth-tantalate (SBT) also referred to as $SrBiTa_2O_9$ (though not necessarily at that composition), bismuth-lanthanum-titanate (BLT) also referred to as $(BiLa)_4Ti_3O_{12}$ (though not necessarily at that composition), and barium-strontium-titanate (BST) also referred to as $BaSrTiO_3$ (though not necessarily at that composition). As noted above, the second element of the compound of the bottom electrode is an element present in the ferroelectric layer. Thus, in an exemplary aspect, the ferroelectric layer 304 can comprise PZT, and the second element can be selected from the group consisting of Pb, Zr and Ti. In another exemplary aspect, the ferroelectric layer 304 can comprise SBT, and the second element can be selected from the group consisting of Sr, Bi, and Ta. In a further exemplary aspect, the ferroelectric layer 304 can comprise BLT, and the second element can be selected from the group consisting of Bi, La and Ti. In a further exemplary aspect, the ferroelectric layer 304 can comprise BST, and the second element can be selected from the group consisting of Ba, Sr and Ti.

With regard to the first (bottom) electrode 302, the second element can be Ti, for example, such that the first electrode 302 comprises an Ir—Ti alloy or a Ru—Ti alloy. For example, the first electrode 302 can comprise $Ir_yTi_{1-y}$, wherein y is in the range of about 0.50 to 0.97 (i.e., 0.50±0.02 to 0.97±0.02) in terms of atomic concentration. As will be more apparent from the discussion below, other ranges for x can be beneficial, such as, for example, about 0.55-0.92, about 0.65-0.90 or about 0.70-0.80. A first electrode 302 with an average composition of about $Ir_{0.75}Ti_{0.25}$ can be advantageous. It is believed that the above-noted composition ranges are also applicable for a first electrode 302 comprising an $Ru_yTi_{1-y}$ alloy based in part upon the phase-forming behavior of the Ru—Ti system as reflected in the corresponding binary alloy phase diagram and based in part upon an observation that elevated levels of Ti in the Ir—Ti system can lead to an increase in resistivity upon annealing in oxygen (discussed further below in connection with FIG. 12).

It should be understood that the alloy of the first (bottom) electrode 302 can include other elements in addition to the first element and the second element as described above, if desired, and such is intended to be within the scope of an alloy including the first element and the second element. In particular, additional metallic elements (e.g., transition metal elements) and/or non-metallic elements (e.g., oxygen) can be included in the alloy of bottom electrode 302. For example, an alloy including Ir as the first element and Ti as the second element can further contain Ru and/or oxygen.

As a further example, the second element can be Ti, and the compound of the first electrode 302 can comprise $IrTiO_x$ or $RuTiO_x$. The compounds $IrTiO_x$ and $RuTiO_x$ as used herein refer generally to compounds of Ir (or Ru), Ti and O without regard to the particular atomic concentrations of Ir, Ti and O, wherein "$O_x$" indicates that the amount of oxygen can be either stoichiometric or nonstoichiometric, as is understood to those of ordinary skill in the art. For example, the first electrode can comprise $(Ir_yTi_{1-y})O_x$, wherein y is in the range of about 0.50-0.97 with regard to the relative atomic concentrations of Ir and Ti. For example, the first electrode 302 can comprise a compound with a composition of about $(Ir_{0.5}Ti_{0.5})O_x$, i.e., a stoichiometric or nonstoichiometric compound with approximately a one-to-one ratio of Ir atoms to Ti atoms. As another example, the first electrode 302 can comprise a compound with a composition of about $(Ir_{0.75}Ti_{0.25})O_x$, i.e., a stoichiometric or nonstoichiometric compound with approximately a three-to-one ratio of Ir atoms to Ti atoms. Other ranges for y can be beneficial, such as, for example, about 0.55-0.92, about 0.65-0.90 or about 0.70-0.80, for which the compound can be either stoichiometric or nonstoichiometric with respect to oxygen content. Such composition ranges are believed to be applicable to $(Ru_yTi_{1-y})O_x$ as well. Such compounds can, of course, include additional metallic and/or non-metallic elements, if desired, and the potential presence of such additional elements is intended to be within the scope of compounds such as $IrTiO_x$ and $RuTiO_x$.

The second electrode 306 can be any suitable electrically conducting material such as, for example, Al, Ir, $IrO_2$, combination of Ir and $IrO_2$, Ru, $RuO_2$, combination of Ru and $RuO_2$, Pt, or alloy or multilayer thereof, or an alloy such as described above for the first electrode 302.

As noted previously, any suitable thicknesses and lateral dimensions for the bottom electrode 302, the ferroelectric 304 and the top electrode 306 can be used, the choices of which can be made by one of ordinary skill in the art depending upon desired device specifications and desired performance. For instance, it can be desirable to fabricate devices having an individual capacitor area (lateral area occupied by one ferroelectric capacitor on the substrate) of less than about 0.10 $\mu m^2$, 0.064 $\mu m^2$, or 0.03 $\mu m^2$ (i.e., a capacitor diameter of less than about 0.32 $\mu m$, 0.25 $\mu m$, or 0.17 $\mu m$, respectively). For example, it is believed that a memory fabricated with a 0.15 $\mu m$ design rule (minimum feature size) and having a unit cell size of about 0.225 $\mu m^2$, an individual capacitor area of about 0.10 $\mu m^2$, a capacitor thickness (overall thickness of bottom electrode, ferroelectric layer, and top electrode) of 0.10 $\mu m$, and a capacitor height of about 0.4 $\mu m$ can provide a sensing margin (voltage needed to switch between "0" and "1" polarization states) of about 350 mV. As another example, it is believed that a memory fabricated with a 0.13 $\mu m$ design rule and having a unit cell size of about 0.152 $\mu m^2$, an individual capacitor area of about 0.064 $\mu m^2$, a capacitor thickness 0.08 $\mu m$, and a capacitor height of about 0.4 $\mu m$ can provide a sensing margin of about 270 mV. As a further example, it is believed that a memory fabricated with a 0.10 $\mu m$ design rule and having a unit cell size of about 0.08 $\mu m^2$, an individual capacitor area of about 0.03 $\mu m^2$, a capacitor thickness 0.05 $\mu m$, and a capacitor height of about 0.4 $\mu m$ can provide a sensing margin of about 180 mV. Also, a ferroelectric capacitor 301 as described herein can be utilized in devices other than a ferroelectric memory, and the desired characteristics of such devices can dictate the specifications of the ferroelectric capacitor 301 as will be readily apparent to one of ordinary skill in the art.

The first (bottom) electrode 302 can be prepared by any suitable technique such as cosputtering from separate targets onto a substrate, sputtering from a single alloy target, chemical vapor deposition (CVD), or atomic layer deposition, or any other suitable technique including but not limited to those conventionally known to those of ordinary skill in the art. The temperature of the substrate during deposition can be an ambient temperature or can be controlled to be different from ambient temperature (e.g., about 200° C.). Also, reactive cosputtering, such as in the presence of oxygen gas (e.g., at an elevated substrate temperature such as about 200° C.), can be used to prepare the first electrode 302, such as in the case of $IrTiO_x$. The second electrode 306 can be formed on the ferroelectric layer 304 by any suitable technique such as such as noted above for the first (bottom) electrode 302, for example.

The ferroelectric layer 304 can be formed on the bottom electrode 302 using any suitable technique such as sputtering, CVD (including metal organic CVD), or by another other suitable technique including but not limited to techniques conventionally known to those of ordinary skill in the art. The ferroelectric layer 304 can be formed on the bottom electrode 302 with or without one or more intervening layers therebetween, such as, for example, a seed layer (e.g., a thin PTO layer). However, it can be desirable to refrain from using such intervening layer(s) because reducing the number of layers formed in the trench 311 can both facilitate manufacturing higher density ferroelectric memories with smaller trench sizes and reduce processing complexity and cost.

The ferroelectric layer can be formed with or without a post-anneal treatment in an oxygen atmosphere (e.g., annealing at 600° C. in an oxygen atmosphere). Post-annealing is generally employed in order to provide a good interface between a metallic electrode and PZT material. PZT-based capacitors can suffer from imprint (i.e., a shift in the hysteresis loop) and high coercive field if no post annealing is performed. It is believed that this is due to poor contact between the top electrode and the PZT layer. When there is either an etching step after the top electrode deposition or passivation process with hydrogen, a post-annealing step with oxygen is generally performed for the purpose of compensating any damage to the PZT layer in certain areas especially around the perimeter of the capacitor, for example. Post-annealing can be performed in any suitable manner as known to those of ordinary skill in the art, e.g., typically 600° C. for 1 or 2 minutes by rapid thermal annealing (RTA) under a continuous flow of oxygen. Post annealing can also improve the density and texture of the PZT material.

Conventional processing techniques known to those of ordinary skill in the art, such as disclosed, for example, in U.S. Pat. Nos. 6,337,216 and 6,605,835, can be used in fabricating ferroelectric memory as described herein. For example, an insulating layer used to make the gate oxide 316 and a metallization layer used to the gate electrode 318 can be deposited on the substrate 310 using any suitable deposition technique(s). Lithographic patterning and etching can then be carried out to define the gate electrodes 318 and the gate oxides 216. Ion-implantation can then be carried out using the gate electrodes 318 as a self-aligned mask, for instance, to form the source and drain regions 314 and 312 (with suitable masking to protect other areas from being implanted). Patterning and metallization can then be carried out to form word lines and bit lines connected to the gate electrodes 318 and source regions 314, respectively. An insulating material can then be deposited on the structure to form the first insulating layer 320, which can be processed by chemical-mechanical polishing (CMP) to provide a smooth surface.

Openings for the contact plugs 322 can then be formed in the insulating layer 320 by lithographic patterning and etching, and appropriate materials, such as those noted above, can be deposited by any suitable technique (e.g., sputtering, evaporation, CVD) to form the contact plugs 322 and the barrier layers 324. The insulating layer 320 with the plug and barrier materials deposited thereon can be further processed by CMP to produce a smooth surface. A second insulating layer 328 can then be deposited by any suitable technique (e.g., sputtering, CVD), and trenches 311 can be formed in the second insulating layer 328 by conventional patterning and etching. The ferroelectric capacitors 301 can then be formed within the trenches 311 with electrical contact to the contact plugs 322 by techniques noted above. The second insulating layer 328 can be further grown above the ferroelectric capacitor 301 and can be processed by CMP, and the resulting surface can be patterned and etched to provide openings for the plate lines 330 to contact the top electrodes 306. Any suitable technique (e.g., sputtering, evaporation, CVD) can be used to form the plate lines 330.

As illustrated in FIG. 3A, the first and second electrodes 302, 306 and the ferroelectric layer 30 can be formed on a side wall (or side walls) and the bottom of the trench 311, thereby creating a large capacitance area without enlarging the surface area occupied by an individual capacitor. Forming the ferroelectric capacitor 301 using such a three dimensional configuration can be useful for obtaining sufficient capacitance at reduced capacitor sizes suitable for higher density ferroelectric memories including memories with minimum feature sizes of, for example, less than about 0.15 μm, 0.13 μm, or 0.1 μm having individual capacitor areas of less than about 0.1 μm$^2$, 0.064 μm$^2$, or 0.03 μm$^2$, respectively.

Figure 3B:
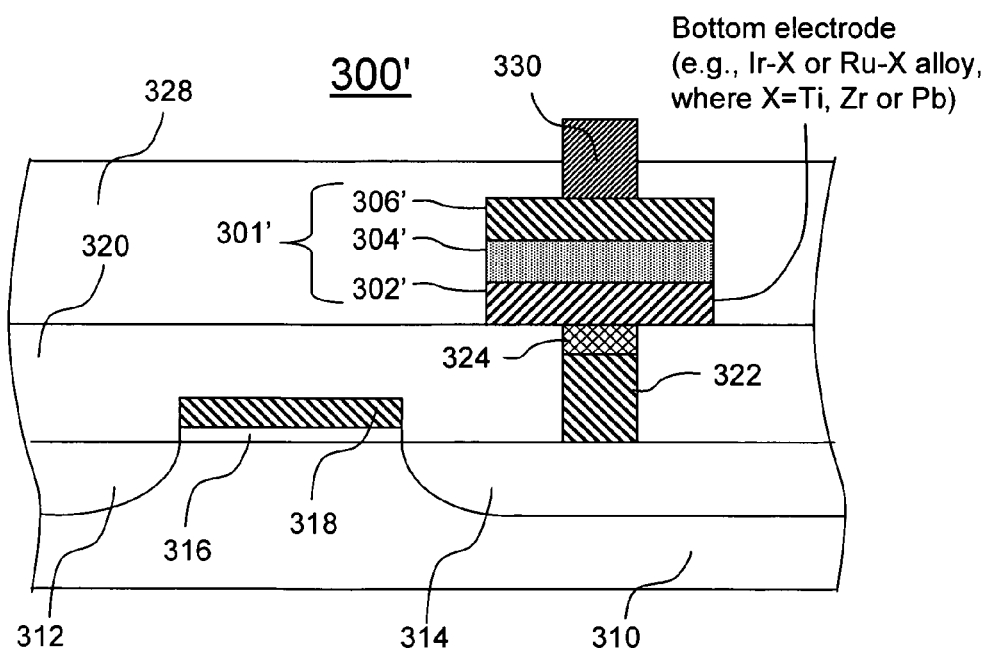

FIG. 3B illustrates another type of ferroelectric capacitor 301' that can be used in a ferroelectric memory or other type of electronic device. For example, FIG. 3B illustrates a portion of a memory cell 300' of another exemplary ferroelectric memory having a ferroelectric capacitor 301' with a planar configuration, as opposed to a trench configuration such as shown in FIG. 3A. The ferroelectric capacitor 301' shown in FIG. 3B includes a first (bottom) electrode 302', a ferroelectric layer 304' formed on the first electrode 302', and a second (top) electrode 306' formed on the ferroelectric layer 304'. The first electrode 302' comprises a compound having a composition as described above in connection with the example of FIG. 3A, and the ferroelectric layer 304' and the second electrode 306' can be formed of the same materials as described above in connection with the example of FIG. 3A. The layers 302', 304' and 306' can be formed using similar techniques as described above in connection with the example of FIG. 3A. Other features illustrated in FIG. 3B that are similar to corresponding features illustrated in FIG. 3A are labeled with like reference numerals, and have already been discussed in connection with FIG. 3A.

It should be understood that the ferroelectric capacitors and corresponding memory structures illustrated in FIGS. 3A and 3B are intended to be illustrative and not restrictive. Ferroelectric capacitors having a bottom electrode comprising a compound with compositions as disclosed herein can be employed in any type of FRAM configuration that utilizes ferroelectric capacitors, including both destructive read out (DRO) devices and non-destructive read out (NDRO) devices. For example, ferroelectric capacitors as disclosed herein can be employed in conventional FRAM configurations in which a ferroelectric capacitor is positioned at the gate of a transistor, the bottom electrode being disposed on the gate oxide. In addition, the ferroelectric capacitors 301 and 301' illustrated in FIGS. 3A and 3B can be utilized as circuit elements in devices other than ferroelectric memories, wherein transistors and/or other types of circuit elements can be connected to the ferroelectric capacitors 301 and 301'.

Figure 1:
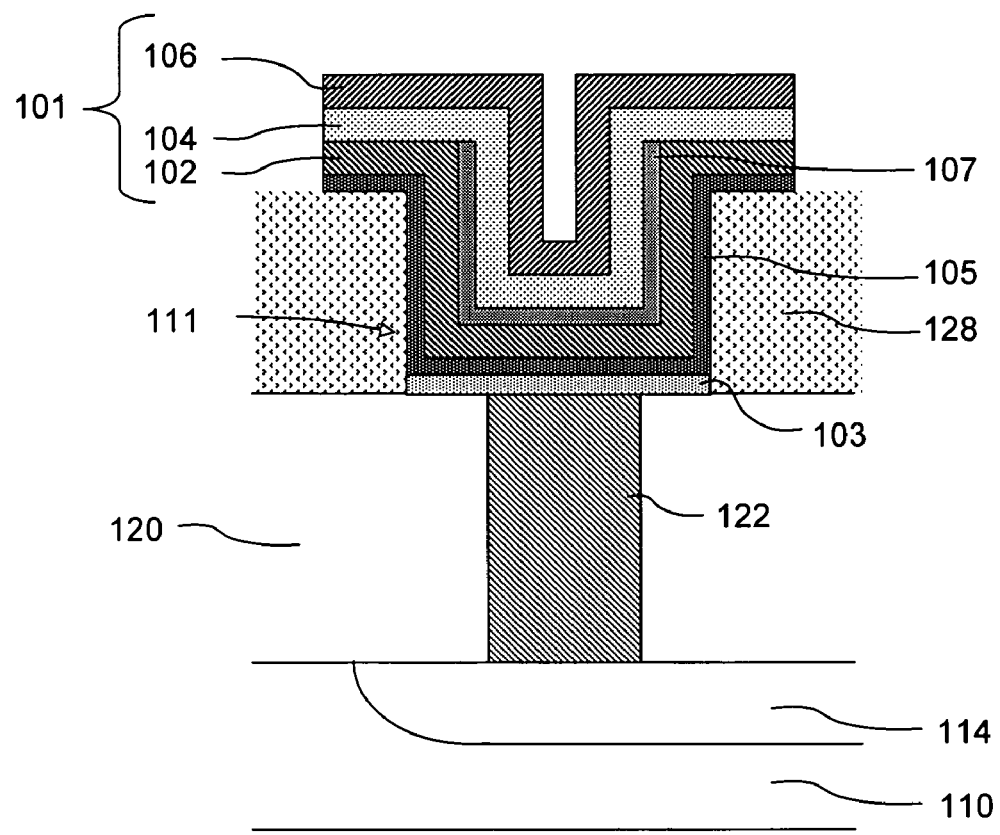
FIG. 1 is a schematic illustration of a portion of a FRAM cell comprising a conventional three-dimensional ferroelectric capacitor.
Figure 2:
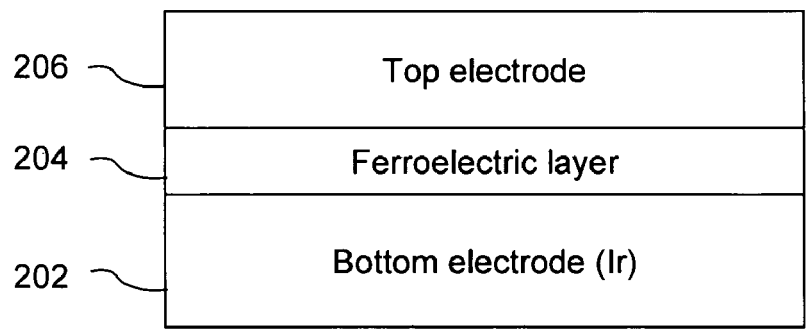
FIG. 2 is a schematic illustration of a conventional ferroelectric capacitor.

A ferroelectric memory such as described above in connection with the example of FIG. 3A can have an advantage of a reduced number of layers in the trench 311 compared to the conventional ferroelectric memory illustrated in FIG. 1, thereby reducing processing complexity and cost, and also facilitating the fabrication of higher density memories with reduced cell sizes. In particular, by choosing the first (bottom) electrode 302 to comprise a compound that includes a first element (Ir or Ru) and a second element as described herein (e.g., Ti, Zr, Pb), it is believed that the first electrode 302 can possess sufficient adhesion to the trench sidewall(s) of the second insulating layer 328 without the use of an additional adhesion layer therebetween. Thus, in a ferroelectric memory such as illustrated in FIG. 3A, an adhesion layer (e.g., such as Ti adhesion layer 105 in FIG. 1) between the first electrode 302 and the trench sidewall(s) of the second insulating layer 328 can be avoided. For example, a comparison of film adhesion was carried out wherein an Ir film (a conventional electrode material) was sputtered onto an $SiO_2$ layer formed on a Si substrate. The Ir film possessed poor adhesion to the $SiO_2$ layer and suffered spontaneous peeling from the $SiO_2$ layer. In contrast, an alloy film of $Ir_{0.76}Ti_{0.24}$ was deposited by cosputtering on an $SiO_2$ layer formed on a Si substrate, and the $Ir_{0.76}Ti_{0.24}$ film exhibited excellent adhesion to the $SiO_2$ layer.

Figure 12:
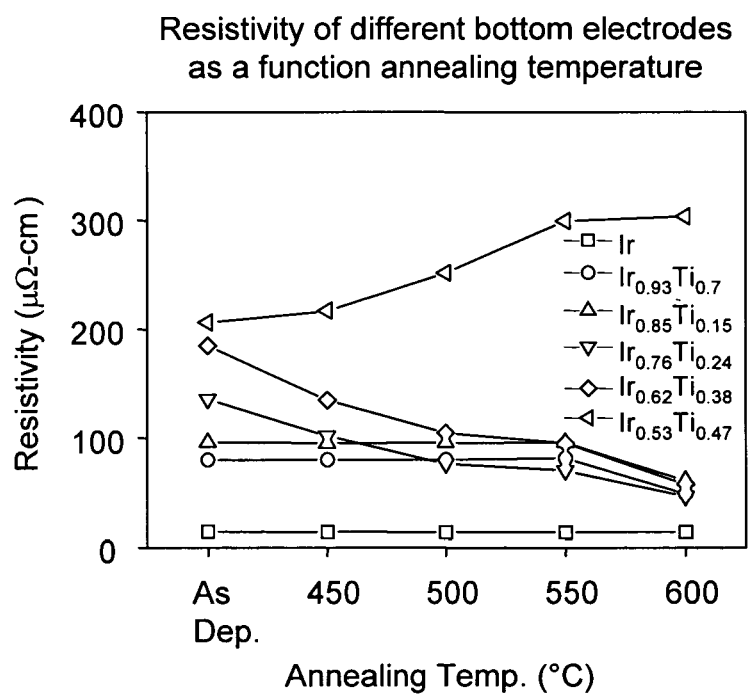
FIG. 12 shows a plot of resistivity for bottom electrodes of Ir and $Ir_yTi_{1-y}$ of different compositions as a function of annealing temperature.

Moreover, as will be further discussed below in connection with FIG. 12, it is believed that choosing the first (bottom) electrode 302 to comprise a compound that includes a first element (Ir or Ru) and a second element as described herein (e.g., Ti, Zr, Pb) can further reduce the number of layers because the bottom electrode can effectively serve as an oxidation barrier, such that an additional oxidation barrier layer at the bottom of the trench 311 can be avoided (e.g., a conventional oxidation barrier such as layer 103 shown in FIG. 1 can be avoided).

Choosing the second element of the compound of the first electrode 302 to be an element that is also present in the ferroelectric material of the ferroelectric layer 304 (e.g., Ti, Zr, Pb) can also assist in reducing the number of layers in the trench 311. In particular, by choosing the second element to be an element that is also present in the ferroelectric layer 304, it is believed that a high quality ferroelectric layer 304 can be obtained without the use of a seed layer between the first electrode 302 and the ferroelectric layer 304 (e.g., such as PTO seed layer 107 shown in FIG. 1). Thus, in a ferroelectric memory such as illustrated in FIG. 3A, a seed layer between the first electrode 302 and the ferroelectric layer 304 can be avoided. It is believed that the presence of the second element in the compound of the first electrode 302, which is also an element present in the ferroelectric layer 304, can assist in promoting the growth of high quality crystalline ferroelectric material in a manner similar to that of a seed layer.

Also, using a compound as described herein for the first electrode 302/302' of the ferroelectric capacitor 301/301' such as shown in FIGS. 3A and 3B can have an advantage of reduced material costs compared to the conventional ferroelectric capacitor 101 illustrated in FIG. 1. In particular, by choosing the first (bottom) electrode to comprise a compound that includes a first element (Ir or Ru) and a second element as described herein (e.g., Pb, Zr, Ti), the material costs of the first electrode can be significantly reduced compared to use of a conventional pure Ir or pure Ru bottom electrode. For example, presently, the cost of Ir target materials is approximately 300 times greater than the cost of Ti target materials. Thus, use of a compound as described herein for the bottom electrode can also reduce the material costs of the bottom electrode by reducing the amount of the more expensive metals.

Figure 4A:
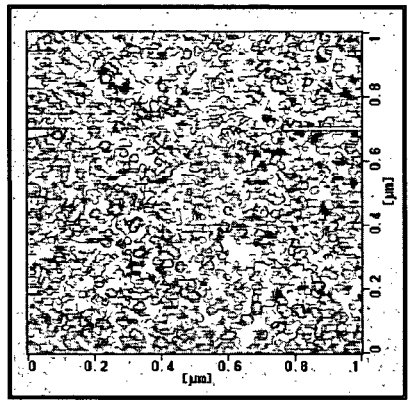
FIGS. 4A and 4B show atomic force microscopy images illustrating surface roughness of an Ir film as deposited and after annealing in oxygen, respectively.
Figure 4B:
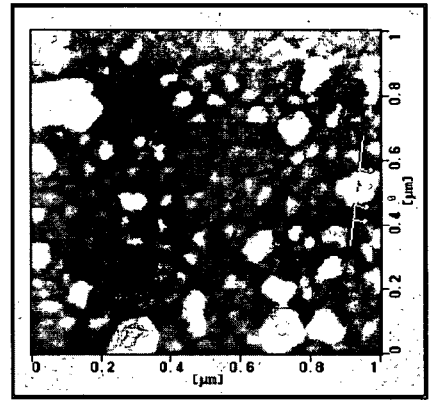

In addition, it is believed that a first (bottom) electrode 302 of a ferroelectric capacitor 301 as described herein can maintain a smoother surface and a greater resistance to grain growth at elevated temperature in the presence of oxygen than a conventional pure Ir bottom electrode 102 such as illustrated in FIG. 1. For example, FIG. 4A shows an atomic force microscopy (AFM) image of a surface of a pure Ir film with a thickness of about 100 nm as deposited by DC sputtering from an Ir target in argon gas onto an $SiO_2$ layer on a Si substrate (an $SiO_2$ layer on a Si substrate is also referred to herein as an $Si/SiO_2$ substrate). The RMS surface roughness of the film shown in FIG. 4A is 4.4 angstroms (Å). FIG. 4B shows an AFM image of a surface of such an Ir film after annealing in oxygen gas at 600° C. for 30 minutes. The RMS surface roughness of the film shown in FIG. 4B is 130 Å, a substantial increase compared to the as deposited Ir film. Such an increase in surface roughness during annealing can be problematic for production of high density ferroelectric memory using a pure Ir bottom electrode because such surface roughness can be a sizeable percentage (e.g., about 10%) of the desired minimum feature size of the memory.

Figure 5A:
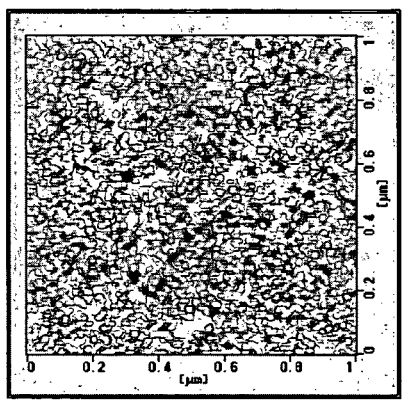
FIGS. 5A and 5B show atomic force microscopy images illustrating surface roughness of an Ir—Ti alloy film as deposited and after annealing in oxygen, respectively.
Figure 5B:
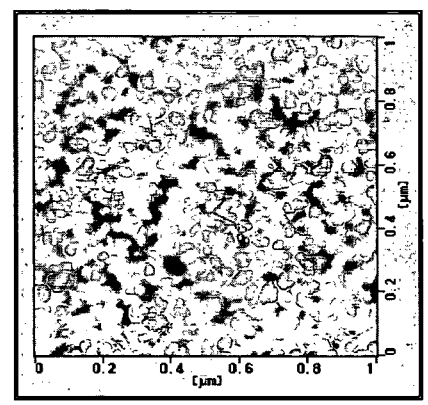

In contrast, FIG. 5A shows an AFM image of a surface of an $Ir_{0.76}Ti_{0.24}$ alloy film having a thickness of about 100 nm as deposited by DC cosputtering from Ir and Ti targets in argon gas onto an $Si/SiO_2$ substrate. The RMS surface roughness of the film shown in FIG. 4A is 5 Å. FIG. 5B shows an AFM image of a surface of an $Ir_{0.76}Ti_{0.24}$ alloy film after annealing in oxygen gas at 600° C. for 30 minutes. The RMS surface roughness of the $Ir_{0.76}Ti_{0.24}$ alloy film shown in FIG. 4B is 27 Å, which is much less than that of the annealed pure Ir film shown in FIG. 4B. Thus, the surface roughness increased by a much smaller amount during annealing in oxygen for the $Ir_{0.76}Ti_{0.24}$ alloy film than for the pure Ir film. Accordingly, it is believed that using a compound as described herein for the bottom electrode of a ferroelectric capacitor can have a significant advantage over a conventional device that uses a conventional pure Ir bottom electrode in terms of the smoothness of the bottom electrode and the smoothness of subsequent films grown thereon. In particular, it is desirable to keep the surface roughness of a ferroelectric layer small so that leakage current can be minimized and retention can be maintained for relatively smaller thicknesses of the ferroelectric layer needed for higher density memories. Thus, it is desirable to keep the surface roughness of the underlying bottom electrode small, because the surface roughness of the bottom electrode can substantially influence the surface roughness of the ferroelectric layer grown thereon.

Also, it is believed that a ferroelectric capacitor having a ferroelectric layer and a first (bottom) electrode that comprises a compound as described herein can have advantageous ferroelectric properties, such as low leakage current, high remnant polarization and good retention. Polarization hysteresis measurements were made on a number of exemplary ferroelectric capacitor samples having a planar configuration (i.e., flat layers deposited onto a flat substrate) to investigate their ferroelectric properties. Exemplary ferroelectric capacitor samples, discussed further below, were fabricated by sputtering bottom electrodes of various compositions onto $Si/SiO_2$ substrates. Ir—Ti alloy bottom electrodes were deposited by DC cosputtering from separate Ir and Ti targets in argon gas, and $IrTiO_x$ bottom electrodes were deposited by reactive DC cosputtering from separate Ir and Ti targets in a mixture of argon and oxygen gas. PZT ferroelectric layers were deposited on the bottom electrodes by metal-organic chemical vapor deposition (MOCVD). Top electrodes were deposited on the PZT ferroelectric layers by DC sputtering in argon gas. Samples were post-annealed in an oxygen atmosphere at 600 degrees C. Compositions of the Ir—Ti alloy electrodes were determined by X-ray photoelectron spectroscopy (XPS).

Figure 6A:
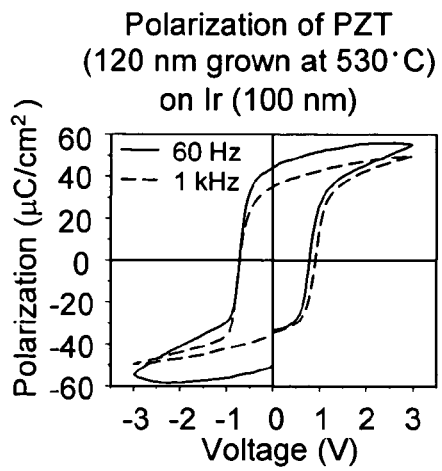
FIGS. 6A and 6B illustrate P-V hysteresis curves for exemplary ferroelectric capacitors employing an Ir bottom electrode and an Ir—Ti bottom electrode, respectively.

FIG. 6A shows polarization hysteresis curves measured at 60 Hz and at 1 kHz for a ferroelectric capacitor sample having a pure Ir bottom electrode with a thickness of about 100 nm, a PZT layer deposited at 530° C. with a thickness of about 120 nm, and a Pt top electrode with a thickness of about 100 nm. As shown in FIG. 6A, the 60 Hz curve (solid line) exhibits a significant discontinuity at zero applied voltage and rather blunt endpoints at the maximum positive and negative applied voltages. As known to those of ordinary skill in the art, blunt end points of hysteresis curves, as opposed to sharper end points, are indicative of depolarization and current leakage in the ferroelectric layer. In addition, discontinuities at zero voltage in the hysteresis curves are indicative of depolarization due to incomplete compensation and screening of charges. The 1 kHz curve in FIG. 6A (dotted line) possesses sharper end points and less of a discontinuity at zero applied voltage. The curves in FIG. 6A reflect crossover points at about −0.72 volts and 0.87 volts, and a remnant polarization (2Pr) of about 73 μC/cm².

Figure 6B:
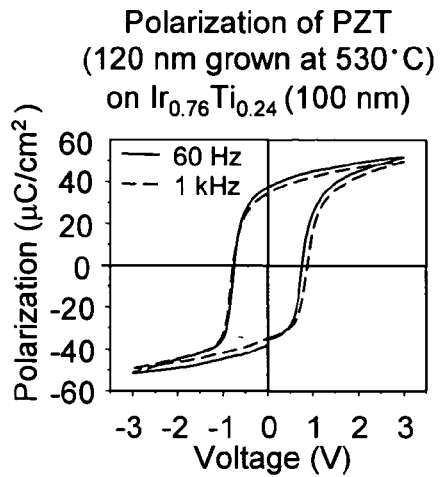

FIG. 6B shows polarization hysteresis curves measured at 60 Hz and at 1 kHz for a ferroelectric capacitor sample having an $Ir_{0.76}Ti_{0.24}$ alloy bottom electrode with a thickness of about 100 nm, a PZT layer deposited at 530° C. with a thickness of about 120 nm, and a Pt top electrode with a thickness of about 100 nm. In contrast to the hysteresis curves shown in FIG. 6A, both the 60 Hz and 1 kHz curves shown in FIG. 6B possess sharp endpoints and relatively little discontinuity at zero applied voltage. The curves in FIG. 6B reflect crossover points at about −0.80 volts and 0.83 volts (i.e., better cross over symmetry compared to the curves in FIG. 6A), and a remnant polarization (2Pr) of about 77 μC/cm² (i.e., a higher remnant polarization than the curves in FIG. 6A). Thus, using a compound as described herein for the bottom electrode of a ferroelectric capacitor can provide better ferroelectric properties compared to devices with conventional Ir bottom electrodes.

Figure 7A:
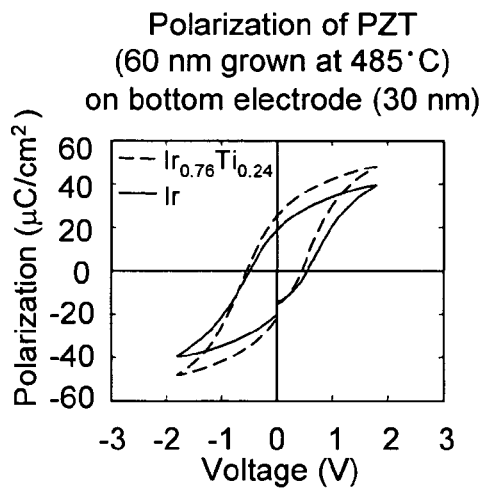
FIG. 7A illustrates P-V hysteresis curves for exemplary ferroelectric capacitors employing an Ir bottom electrode and an Ir—Ti bottom electrode, respectively.

FIG. 7A shows polarization hysteresis curves for two PZT ferroelectric capacitor samples having a pure Ir bottom electrode and an $Ir_{0.76}Ti_{0.24}$ alloy bottom electrode, respectively. In each case the bottom electrode had a thickness of about 30 nm, the PZT layer was deposited at 485° C. and had a thickness of about 60 nm, and the Pt top electrode had a thickness of about 100 nm. The remnant polarization (2Pr) for the sample with the $Ir_{0.76}Ti_{0.24}$ bottom electrode was about 37 μC/cm², whereas the remnant polarization (2Pr) for the sample with the pure Ir bottom electrode was about 32 μC/cm². Thus, again, it is believed using a compound as described herein for the bottom electrode of a ferroelectric capacitor can provide a ferroelectric capacitor with a higher remnant polarization compared to devices with conventional Ir bottom electrodes.

Figure 7B:
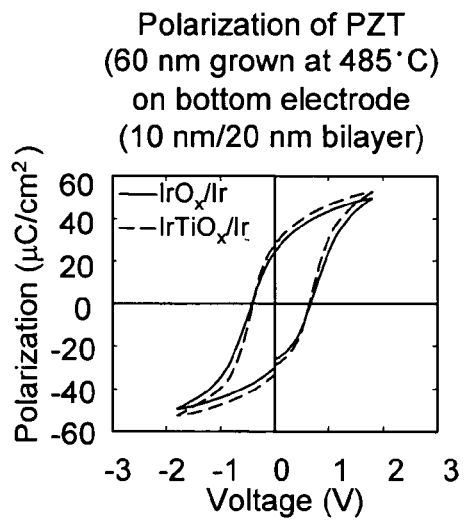
FIG. 7B illustrates P-V hysteresis curves for exemplary ferroelectric capacitors employing an $IrO_x$/Ir bottom electrode and an $IrTiO_x$/Ir bottom electrode, respectively.

FIG. 7B shows polarization hysteresis curves for two PZT ferroelectric capacitor samples having an $IrO_x$/Ir bottom electrode and an $(Ir_{0.76}Ti_{0.24})O_x$/Ir bottom electrode, respectively. In each case the bottom electrode had a thickness of about 30 nm (10 nm of Ir compound disposed on 20 nm of pure Ir), the PZT layer was deposited at 485° C. and had a thickness of about 60 nm, and the Pt top electrode had a thickness of about 100 nm. The remnant polarization (2Pr) for the sample with the bottom electrode comprising $(Ir_{0.76}Ti_{0.24})O_x$ was about 47 μC/cm², whereas the remnant polarization (2Pr) for the sample with the bottom electrode comprising $IrO_x$ was about 43 μC/cm². Thus, it is believed that using an $IrTiO_x$ compound as described herein for the bottom electrode of a ferroelectric capacitor can provide a higher remnant polarization compared to devices with pure Ir or $IrO_x$ bottom electrodes. Further, as reflected by a comparison of FIGS. 7B and 7A, it is believed that a ferroelectric capacitor with a bottom electrode comprising an an $IrTiO_x$ compound as described herein can have a remnant polarization high than that of devices with Ir—Ti alloy bottom electrodes.

In addition, it is believed that a ferroelectric capacitor having a bottom electrode of $IrTiO_x$ or $RuTiO_x$ as described herein (e.g., $(Ir_{0.76}Ti_{0.24})O_x$) can have advantages of predictable oxidation behavior, greater control of oxide formation, and reduced diffusion of oxygen out of an adjacent ferroelectric layer compared to a conventional device using a pure Ir bottom electrode. In particular, it is believed that the presence of oxygen in the oxide of the bottom electrode can reduce diffusion of oxygen out of the adjacent ferroelectric layer (e.g., PZT layer) because the oxygen concentration gradient is smaller. This reduced diffusion reduces oxygen vacancies in the ferroelectric layer (e.g., PZT layer) that might otherwise occur and that might cause deleterious effects (e.g., increased fatigue and retention loss). In other words, it is believed that such an $IrTiO_x$ or $RuTiO_x$ bottom electrode can further stabilize the adjacent ferroelectric layer.

Figure 8A:
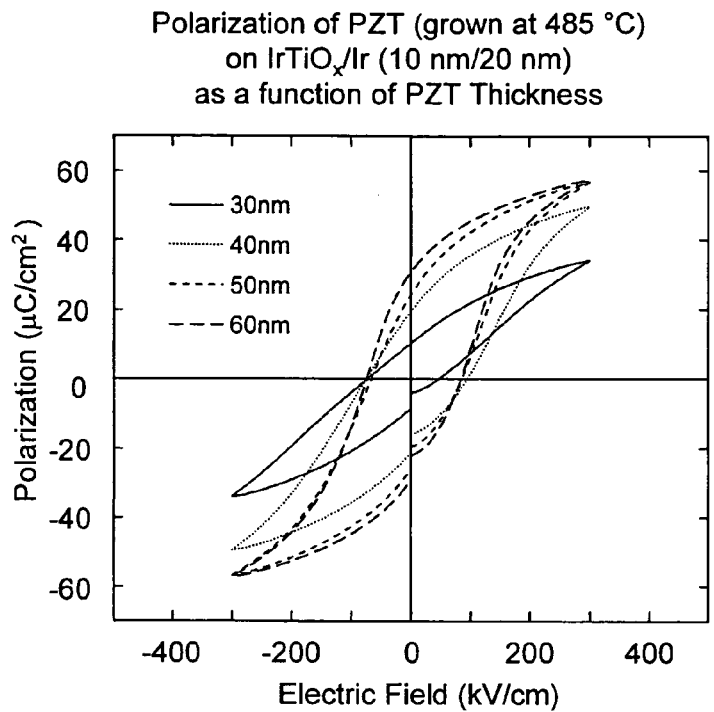
FIG. 8A illustrates P-V hysteresis curves for exemplary ferroelectric capacitors employing $IrTiO_x$/Ir bottom electrodes as a function of PZT layer thickness.

Effects of PZT ferroelectric layer thickness on ferroelectric properties of capacitor samples having Ir, $IrO_x$ and $IrTiO_x$ bottom electrodes were also examined. FIG. 8A illustrates P-V hysteresis curves for exemplary ferroelectric capacitor samples employing $(Ir_{0.76}Ti_{0.24})O_x$/Ir bottom electrodes and having different thicknesses of the PZT layer. In the FIG. 8A examples, the bottom electrodes had thicknesses of 30 nm (20 nm of oxide disposed on 10 nm of pure Ir). The PZT layers had thicknesses of 30 nm, 40 nm, 50 nm and 60 nm, respectively. As shown in FIG. 8, remnant polarization (2Pr) increased with PZT thickness for these samples. In particular, remnant polarizations of about 16 μC/cm² (30 nm PZT), about 29 μC/cm² (40 nm PZT), about 37° C./cm² (50 nm PZT), and about 47 μC/cm² (60 nm PZT) were measured for these samples.

Figure 8B:
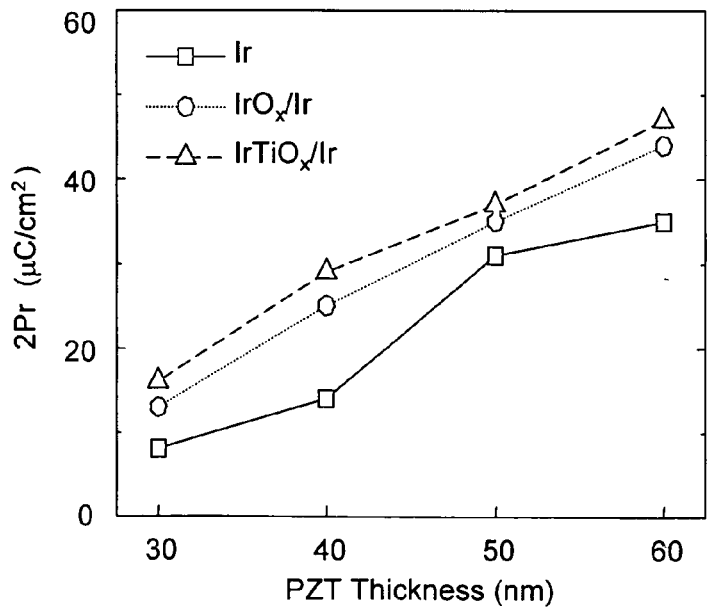
FIG. 8B shows a plot of remnant polarization (2Pr) versus PZT thickness for ferroelectric capacitors with several different bottom electrodes.

For comparison, ferroelectric capacitor samples were prepared with Ir bottom electrodes (30 nm in thickness) and IrOx/Ir bottom electrodes (20 nm oxide on 10 nm Ir) for each of the PZT thicknesses noted above (30 nm, 40 nm, 50 nm and 60 nm). Polarization hysteresis curves for these samples were measured (with a maximum applied voltage of ±300 V), and remnant polarizations were determined. FIG. 8B shows results of these measurements as well as results for the samples employing $(Ir_{0.76}Ti_{0.24})O_x$/Ir bottom electrodes (discussed in connection with FIG. 8A). As shown in FIG. 8B, ferroelectric capacitor samples employing $(Ir_{0.76}Ti_{0.24})O_x$/Ir bottom electrodes had higher remnant polarizations than other samples employing pure Ir bottom electrodes or $IrO_x$ bottom electrodes for each of the above-noted PZT layer thicknesses.

Figure 9:
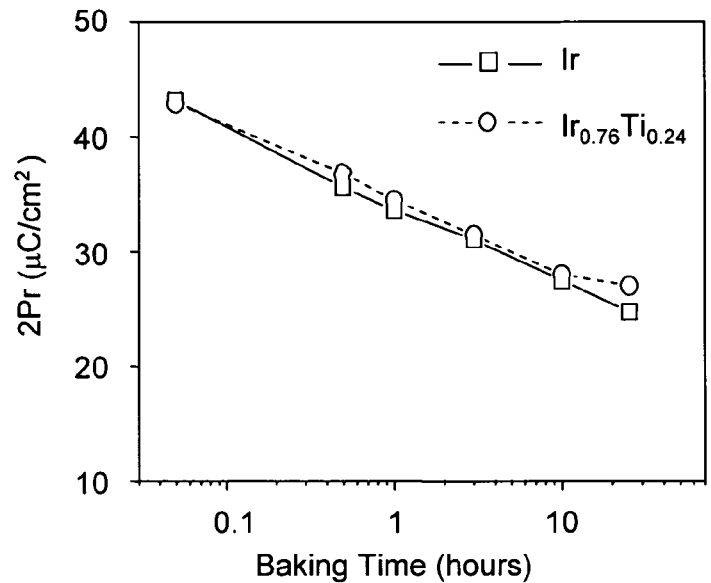
FIG. 9 shows a plot of remnant polarization (2Pr) for two ferroelectric capacitors having an Ir bottom electrode and an Ir—Ti bottom electrode, respectively, as a function of baking time.

Retention properties were also compared for a ferroelectric capacitor sample having an $Ir_{0.76}Ti_{0.24}$ alloy bottom electrode and a ferroelectric capacitor sample having a pure Ir bottom electrode. Each sample had a bottom electrode thickness of about 100 nm, a PZT layer thickness of about 100 nm, and a Pt top electrode thickness of about 100 nm. Polarization hysteresis curves were measured for the samples as prepared as well as after baking in ambient air at 150° C. for various baking times. The polarization measurements were carried out at 85° C. FIG. 9 shows remnant polarization as a function of baking time for these samples. As reflected in FIG. 9, the remnant polarization after 25 hours of baking was greater for the ferroelectric capacitor sample employing the $Ir_{0.76}Ti_{0.24}$ alloy bottom electrode as compared to the sample having a pure Ir bottom electrode. After 25 hours of baking, the ferroelectric capacitor sample employing the $Ir_{0.76}Ti_{0.24}$ alloy bottom electrode retained 63% of its initial remnant polarization, whereas the sample having a pure Ir bottom electrode retained only 57% of its initial remnant polarization. Thus, a ferroelectric capacitor employing an $Ir_{0.76}Ti_{0.24}$ alloy bottom electrode can have greater retention than a ferroelectric capacitor employing a pure Ir bottom electrode.

Figure 10:
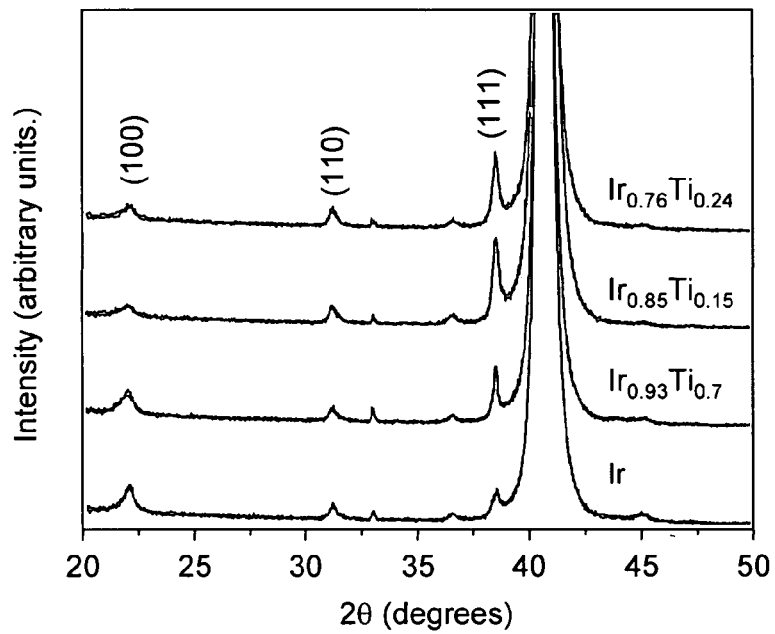
FIG. 10 illustrates X-ray diffraction data for PZT films grown on bottom electrode layers of Ir and $Ir_yTi_{1-y}$ of different compositions without the use of a conventional PTO seed layer between the bottom electrode and the PZT layer, showing a preferred orientation of the PZT layer grown on $Ir_yTi_{1-y}$ as compared to Ir.
Figure 11:
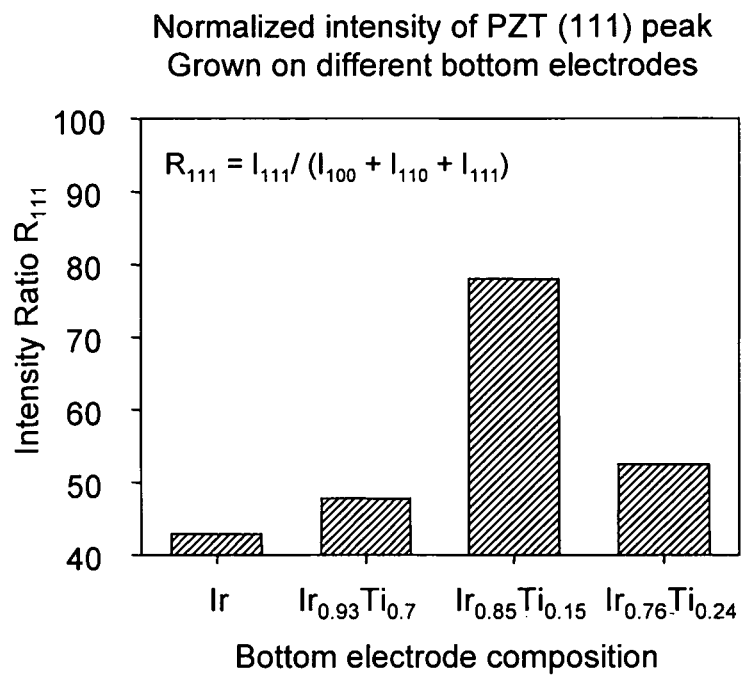
FIG. 11 shows a plot of normalized peak intensity for the PZT (111) peak for the data of FIG. 11 for each of the bottom electrode compositions.

In addition, x-ray diffraction measurements were made on several PZT samples grown on bottom electrode layers of various compositions to investigate orientation properties. In particular, FIG. 10 illustrates X-ray diffraction data for PZT films grown on bottom electrode layers of Ir and $Ir_yTi_{1-y}$ of different compositions without the use of a conventional PTO seed layer between the bottom electrode layer and the PZT layer. The bottom electrodes were deposited onto Si/SiO₂ substrates as described elsewhere herein. As is evident from the data in FIG. 10, the various PZT films had polycrystalline structures. However, PZT films grown on $Ir_yTi_{1-y}$ alloy bottom electrodes had preferred orientations along the (111) direction compared to the PZT film grown on pure Ir, as indicated by the intensity of the PZT (111) peak relative to other peaks. This effect is presented in more detail in FIG. 11, which shows the intensity of the PZT (111) peak normalized to the sum of the intensities of the (100), (110) and (111) peaks. The three samples employing the Ir—Ti alloy bottom electrodes showed greater (111) normalized intensities than the sample grown on pure Ir, and it is believed that such preferred orientation can contribute to better remnant polarization properties for the capacitor samples employing Ir—Ti alloy bottom electrodes. The diffraction measurements were obtained using Cu Kα radiation (1.5405 angstrom wavelength).

Resistivity measurements carried out on Ir—Ti alloy bottom electrode samples showed that various $Ir_yTi_{1-y}$ compositions had comparable resistivity to pure Ir after annealing to 600° C. in oxygen. In particular, FIG. 12 shows a plot of resistivity for bottom electrodes of Ir and $Ir_yTi_{1-y}$ of different compositions for the "as deposited" samples and as a function of annealing temperature for anneals carried out in oxygen for 30 minutes. As illustrated in FIG. 12, the resistivity of the Ir sample was flat as a function of annealing temperature, and the resistivity of four Ir—Ti alloy samples decreased with annealing temperature, ultimately becoming similar to that of pure Ir after annealing at 600° C. For one Ir—Ti alloy sample ($Ir_{0.53}Ti_{0.47}$), the resistivity increased significantly as a function of annealing temperature. Resistivity results for some samples are summarized in Table I below.

| Composition by XPS (atomic percent) | Resistivity of As-Deposited and Annealed Bottom Electrode Samples (μΩ-cm) | | |
|---|---|---|---|
| | As Deposited | 30 min in $O_2$ at 550° C. | 30 min in $O_2$ at 600° C. |
| Ir (100%) | 14 | 13 | 13 |
| $Ir_{0.93}Ti_{0.07}$ | 80 | 81 | 48 |
| $Ir_{0.85}Ti_{0.15}$ | 95 | 95 | 60 |
| $Ir_{0.76}Ti_{0.24}$ | 135 | 70 | 46 |
| $Ir_{0.62}Ti_{0.38}$ | 184 | 95 | 57 |
| $Ir_{0.53}Ti_{0.47}$ | 206 | 298 | 303 |

Whereas it might be expected that an alloy of Ir and Ti could have increased resistivity as a result of oxidation of Ti), surprisingly, the resistivity of Ir—Ti alloys in the composition range of 62-93% Ir actually decreased and became comparable to that of pure Ir after annealing at 600° C. in oxygen. Thus, various benefits of using an Ir—Ti alloy bottom electrode for a ferroelectric capacitor can be realized as described herein, while still maintaining a good resistivity of the bottom electrode, which is believed to be stable at elevated temperature due to oxidation resistance.

Moreover, as mentioned previously herein, the oxidation resistance of such Ir—Ti alloy layers can allow reducing the number of layers in the trench 311 of a ferroelectric memory cell 300 (FIG. 3) because the bottom electrode can effectively serve as an oxidation barrier, such that an additional oxidation barrier layer in the trench 311 can be avoided (e.g., a conventional oxidation barrier such as layer 103 shown in FIG. 1 can be avoided).

Various exemplary ferroelectric capacitors have been described herein, and measurements on exemplary samples comprising $Ir_yTi_{1-y}$ or $Ir_yTi_{1-y}O_x$ compounds have also been described. Based in part on these measurements and based in part on a review of binary alloy phase diagrams for other Ir-based alloys (e.g., which show formation of stable compounds), it is believed that bottom electrodes employing Ir-based compounds comprising a second metallic element that is also a constituent of a ferroelectric material as described herein can be used in ferroelectric capacitors. In addition, the use of pure Ru as a bottom electrode is conventionally known, but it is believed that use of pure Ru as a bottom electrode may present problems similar to those encountered with pure Ir as described herein. Based in part on a review of binary alloy phase diagrams for various Ru-based alloys (e.g., which show formation of stable compounds) and based in part on similarities between various properties of Ir and Ru, it is expected that bottom electrodes comprising Ru-based compounds can be used in ferroelectric capacitors as described herein. It is believed that ferroelectric capacitors employing Ru-based compounds in bottom electrodes as described herein can provide similar performance to ferroelectric capacitors employing Ir-based compounds for bottom electrodes as described herein.

The embodiments described herein are merely illustrative and should not be considered restrictive in any way. The scope of the invention is given by the appended claims rather than the preceding description and all variations and equivalents which fall within the range of the claims are intended to be embraced therein.

What is claimed is:

1. A ferroelectric capacitor, comprising:
    a first electrode comprising a compound, the compound consisting essentially of an Ir—Ti alloy or a Ru—Ti alloy, and the compound including a first metallic element and a second metallic element of the periodic table of the elements, the first metallic element being selected from the group consisting of Ir and Ru;
    a ferroelectric layer disposed in direct contact with the compound of the first electrode, wherein the ferroelectric layer comprises a ferroelectric material containing the second metallic element, the second metallic element is Ti; and
    a second electrode disposed on the ferroelectric layer.

2. The ferroelectric capacitor of claim 1, wherein the ferroelectric layer comprises one of lead-zirconate-titanate, strontium-bismuth-tantalate, bismuth-lanthanum-titanate and barium-strontium-titanate.

3. The ferroelectric capacitor of claim 1, wherein the ferroelectric layer comprises lead-zirconate-titanate, and wherein the second metallic element is selected from the group consisting of Pb, Zr and Ti.

4. The ferroelectric capacitor of claim 1, wherein the first metallic element is Ir.

5. The ferroelectric capacitor of claim 1, wherein the compound comprises $IrTiO_x$ or $RuTiO_x$.

6. The ferroelectric capacitor of claim 1, wherein the compound is an alloy $Ir_yTi_{1-y}$, wherein y is in the range of about 0.50-0.97.

7. The ferroelectric capacitor of claim 1, wherein the compound is an alloy having an average composition of about $Ir_{0.75}Ti_{0.25}$.

8. A ferroelectric memory, comprising:
    a substrate; and
    a plurality of memory cells arranged on the substrate, each memory cell comprising a first electrode comprising a compound, the compound consisting essentially of an Ir—Ti alloy or a Ru—Ti alloy, and the compound including a first metallic element and a second metallic element of the periodic table of the elements, the first metallic element being selected from the group consisting of Ir and Ru, a ferroelectric layer disposed in direct contact with the compound of the first electrode, wherein the ferroelectric layer comprises a ferroelectric material containing the second metallic element, the second metallic element is Ti, and a second electrode disposed on the ferroelectric layer.

9. The ferroelectric memory of claim 8, wherein the ferroelectric layer comprises one of lead-zirconate-titanate, strontium-bismuth-tantalate, bismuth-lanthanum-titanate and barium-strontium-titanate.

10. The ferroelectric memory of claim 8, wherein the ferroelectric layer comprises lead-zirconate-titanate (PZT), and wherein the second element is selected from the group consisting of Pb, Zr and Ti.

11. The ferroelectric memory of claim 8, wherein the first element is Ir.

12. The ferroelectric memory of claim 8, the compound comprises $IrTiO_x$ or $RuTiO_x$.

13. The ferroelectric memory of claim 8, wherein the compound is an alloy $Ir_yTi_{1-y}$, wherein y is in the range of about 0.50-0.97.

14. The ferroelectric memory of claim 8, wherein the compound is an alloy having an average composition of about $Ir_{0.75}Ti_{0.25}$.

15. A method of fabricating a ferroelectric capacitor, comprising:

forming a first electrode consisting essentially of a compound, the compound comprising an Ir—Ti alloy or a Ru—Ti alloy, and the compound including a first metallic element and a second metallic element of the periodic table of the elements, the first metallic element being selected from the group consisting of Ir and Ru;

forming a ferroelectric layer on the first electrode, wherein the ferroelectric layer comprises a ferroelectric material containing the second metallic element, the second metallic element is Ti; and forming a second electrode on the ferroelectric layer.

16. The method of claim 15, wherein the ferroelectric layer comprises one of lead-zirconate-titanate, strontium-bismuth-tantalate, bismuth-lanthanum-titanate and barium-strontium-titanate.

17. The method of claim 15, wherein the ferroelectric layer comprises lead-zirconate-titanate, and wherein the second element is selected from the group consisting of Pb, Zr and Ti.

18. The method of claim 15, wherein the first element is Ir.

19. The method of claim 15, wherein the compound comprises $IrTiO_x$ or $RuTiO_x$.

20. The method of claim 15, wherein the compound is an alloy $Ir_yTi_{1-y}$, wherein y is in the range of about 0.50-0.97.

21. The method of claim 15, wherein the compound is an alloy having an average composition of about $Ir_{0.75}Ti_{0.25}$.

22. The method of claim 15, further comprising forming the ferroelectric capacitor as part of a memory cell of a ferroelectric memory.

* * * * *